(12) United States Patent
Xie et al.

(10) Patent No.: US 10,559,686 B2
(45) Date of Patent: Feb. 11, 2020

(54) METHODS OF FORMING GATE CONTACT OVER ACTIVE REGION FOR VERTICAL FINFET, AND STRUCTURES FORMED THEREBY

(71) Applicant: GLOBALFOUNDRIES INC., Grand Cayman (KY)

(72) Inventors: Ruilong Xie, Schenectady, NY (US); Hui Zang, Guilderland, NY (US); Steven R. Soss, Cornwall, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/018,970

(22) Filed: Jun. 26, 2018

(65) Prior Publication Data
US 2019/0393342 A1 Dec. 26, 2019

(51) Int. Cl.
*H01L 29/78* (2006.01)
*H01L 29/06* (2006.01)
*H01L 27/06* (2006.01)
*H01L 29/66* (2006.01)
*H01L 29/08* (2006.01)

(52) U.S. Cl.
CPC ...... *H01L 29/7827* (2013.01); *H01L 27/0688* (2013.01); *H01L 29/0649* (2013.01); *H01L 29/0847* (2013.01); *H01L 29/6656* (2013.01); *H01L 29/66666* (2013.01)

(58) Field of Classification Search
CPC ............ H01L 27/0688; H01L 29/0649; H01L 29/0847; H01L 29/6656; H01L 29/66666; H01L 29/7827
See application file for complete search history.

(56) References Cited

U.S. PATENT DOCUMENTS

| | | | |
|---|---|---|---|
| 9,245,885 B1* | 1/2016 | Xie | H01L 27/0886 |
| 9,876,015 B1* | 1/2018 | Balakrishnan | H01L 27/092 |
| 9,972,494 B1 | 5/2018 | Bentley et al. | |
| 10,068,987 B1* | 9/2018 | Zang | H01L 29/66666 |
| 10,090,204 B1* | 10/2018 | Zang | H01L 29/7827 |
| 2012/0195122 A1 | 8/2012 | Ohmaru | |
| 2016/0268434 A1 | 9/2016 | Ching et al. | |
| 2017/0358497 A1* | 12/2017 | Cheng | H01L 21/823418 |
| 2019/0214343 A1* | 7/2019 | Lee | H01L 21/823437 |

* cited by examiner

Primary Examiner — Allan R Wilson
(74) Attorney, Agent, or Firm — Anthony Canale; Hoffman Warnick LLC

(57) ABSTRACT

Methods of making a vertical FinFET device having an electrical path over a gate contact landing, and the resulting device including a substrate having a bottom S/D layer thereover and fins extending vertically therefrom; a bottom spacer layer over the bottom S/D layer; a HKMG layer over the bottom spacer layer; a top spacer layer over the HKMG layer; a top S/D layer on top of each fin; top S/D contacts formed over the top S/D layer; an upper ILD layer present in spaces around the top S/D contacts; an isolation dielectric within a portion of a recess of top S/D contacts located above adjacent fins; a gate contact landing within a remaining portion of the recess; a gate contact extending vertically from a bottom surface of the gate contact landing and contacting a portion of the HKMG layer; and an electrical path over at least the gate contact landing.

20 Claims, 15 Drawing Sheets

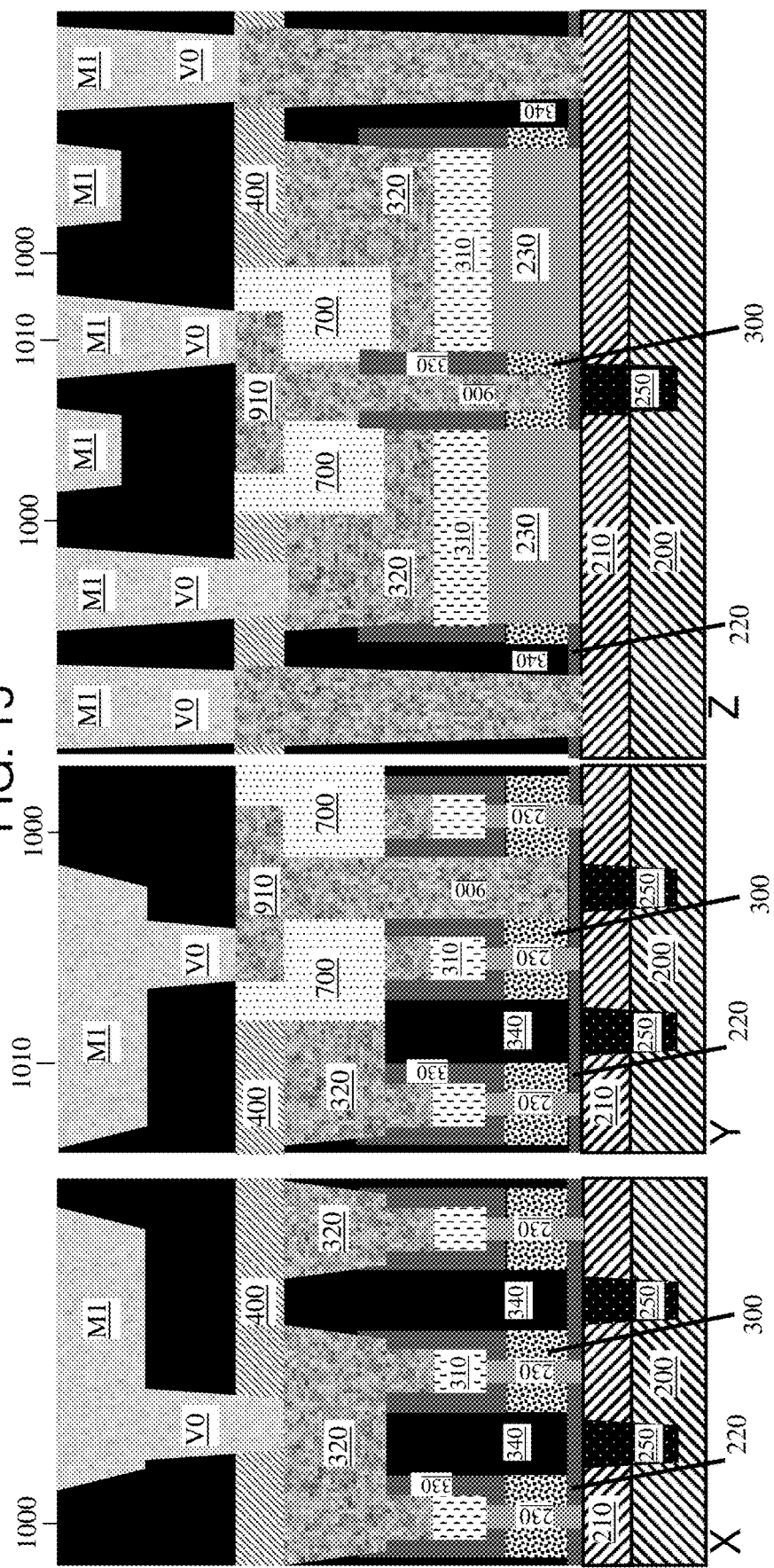

METHODS OF FORMING GATE CONTACT OVER ACTIVE REGION FOR VERTICAL FINFET, AND STRUCTURES FORMED THEREBY

TECHNICAL FIELD

The subject matter disclosed herein relates to gate contact landing regions for fin field effect transistors (FinFETs) of semiconductors. More specifically, various aspects described herein relate to methods of forming a gate contact over an active region for a vertical FinFET and structures formed thereby.

BACKGROUND

As integrated circuits continue to scale downward in size, the FinFET is still an attractive device for use in semiconductor integrated circuits (ICs). With FinFETs, as with other transistor types, contacts that connect to the source, drain, and gate of the transistor to other structure are an important factor in the production of reliable integrated circuits with desired performance characteristics. FinFETs in a vertical configuration (vertical FinFETs) are a strong candidate for potentially extending current semiconductor technology to its scaling limits. For example, with an excellent performance/area ratio, gate-all-around vertical FinFETs are particularly strong candidates for making, for instance, highly dense static random access memory (SRAM) cells for semiconductors. However, in conventional vertical FinFET devices, the cell height is quite tall thereby impacting scalability, and gate contact placement is typically restricted to the middle of the cell located over the isolation region which limits routing flexibility (e.g., only metal lines in a vertical direction can be used for gate contact signals). Without more gate contact placement flexibility and reduced cell height, scaling down to smaller technology nodes, such as 7, 5 and 3 nanometer technologies and beyond, may not be successful.

BRIEF SUMMARY

Methods of forming a gate contact over an active region for a vertical FinFET and structures formed thereby are disclosed. In a first aspect of the disclosure, a method of forming a gate contact over an active region for a vertical FinFET includes: providing a partial vertical FinFET (VFinFET) structure, the partial VFinFET structure including a substrate having a bottom source/drain (S/D) layer thereover and a plurality of fins extending vertically therefrom, a bottom spacer layer over the bottom S/D layer, a high-k metal gate (HKMG) layer over the bottom spacer layer, and a top spacer layer over the HKMG layer; forming a top S/D layer on a top surface of each of the fins; forming at least two top S/D contacts on the top S/D layer and an upper interlayer dielectric (ILD) layer surrounding the at least two top S/D contacts, the at least two top S/D contacts being located directly above at least two adjacent fins; creating recesses in a portion of each of the at least two top S/D contacts; forming an isolation dielectric within a portion of the recesses, a remaining portion of the recesses being a gate contact landing region above the at least two adjacent fins; removing at least a portion of the upper ILD layer and at least a portion of the top spacer layer between adjacent ends of the at least two adjacent fins to expose a portion of the HKMG layer located thereunder, thereby forming a gate contact opening; and forming a gate contact in the gate contact opening and a gate contact landing in the gate contact landing region.

In a second aspect of the disclosure, the forming of the isolation dielectric and the gate contact landing of the first aspect includes: recessing a portion of the isolation dielectric material and a portion of the upper ILD layer located above and between adjacent fins such that the upper ILD layer located between recessed portions of the isolation dielectric material is maintained, and depositing a metal in the recessed portions of the isolation dielectric material and on the recessed portion of the ILD layer such that the gate contact landing is formed.

In a third aspect of the disclosure, the forming of the isolation dielectric and the gate contact landing of the first aspect includes: removing the upper ILD layer located between the portions of isolation dielectric material, recessing a portion of the isolation dielectric material located above and between adjacent fins, and depositing a metal in the recessed portions of the isolation dielectric material to form the gate contact landing.

In a fourth aspect of the disclosure, a vertical FinFET device having a gate contact over an active region includes: a substrate having a bottom source/drain (S/D) layer thereover and a plurality of fins extending vertically therefrom; a bottom spacer layer over the bottom S/D layer; a high-k metal gate (HKMG) layer over the bottom spacer layer; a top spacer layer over the HKMG layer; a top S/D layer on a top surface of each of the fins; at least two top S/D contacts on the top S/D layer, the at least two top S/D contacts being located directly above at least two adjacent fins; an upper interlayer dielectric (ILD) layer surrounding the at least two top S/D contacts; an isolation dielectric within a portion of a recess in a portion of each of the at least two top S/D contacts; a gate contact landing within a remaining portion of the recess; and a gate contact extending vertically from a bottom surface of the gate contact landing and contacting a portion of the HKMG layer located between adjacent ends of at least two fins.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which:

FIG. 15 is alternative to FIG. 10, FIG. 13 and FIG. 14 and shows X, Y and Z cross-sections of yet another ultimate alternative vertical FinFET structure.

Figure 1:
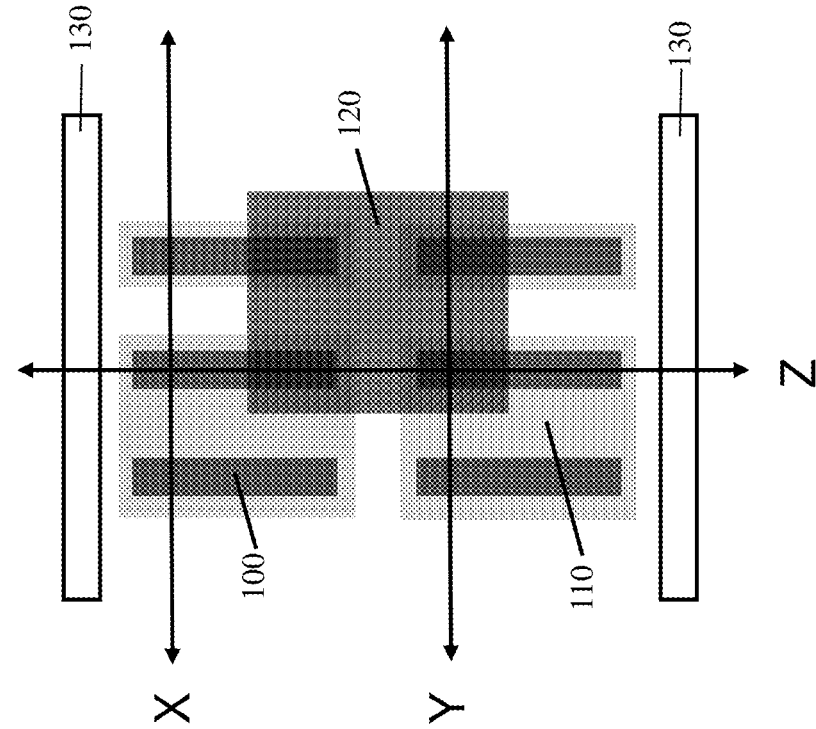
FIG. 1 shows a top-down view of a partial vertical FinFET structure wherein an "X" cross-section, a "Y" cross-section and a "Z" cross-section are shown for reference purposes for the remaining figures. Each of the remaining figures (FIG. 2 through FIG. 15) includes cross-sections X, Y and Z for ease of comprehension of the overall three-dimensional structure resulting from the processes described herein.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

The subject matter disclosed herein relates to gate contact landing regions for fin field effect transistors (FinFETs) of semiconductors. More specifically, various aspects described herein relate to methods of forming gate contact landing regions for vertical FinFETs and structures formed thereby.

As noted above, it can be very difficult to scale the cell height of conventional vertical FinFETs and such conventional vertical FinFETs suffer from gate contact placement and metal line orientation restrictions. In contrast to convention, various aspects of the disclosure include methods of forming gate contact landing regions for vertical FinFETs that allow for greater gate contact placement flexibility and reduced cell height. In other aspects of the disclosure, vertical FinFET devices are formed that allow for additional metal line orientation to access gate contacts, i.e., horizontal metal lines in addition to conventional vertical metal lines. Numerous ways to include such gate contact landing regions in vertical FinFETs are possible while still adhering to the essence of the disclosure.

FIG. 1 depicts a top-down view of a partial vertical FinFET structure wherein an "X" cross-section, a "Y" cross-section and a "Z" cross-section are shown for reference purposes for the remaining FIGS. 2 through 15. The partial reference structure of FIG. 1 includes fins 100, top source/drain (S/D) contacts 110, gate contact landing 120 and bottom S/D contacts 130, all of which will be described in greater detail below.

Figure 9:
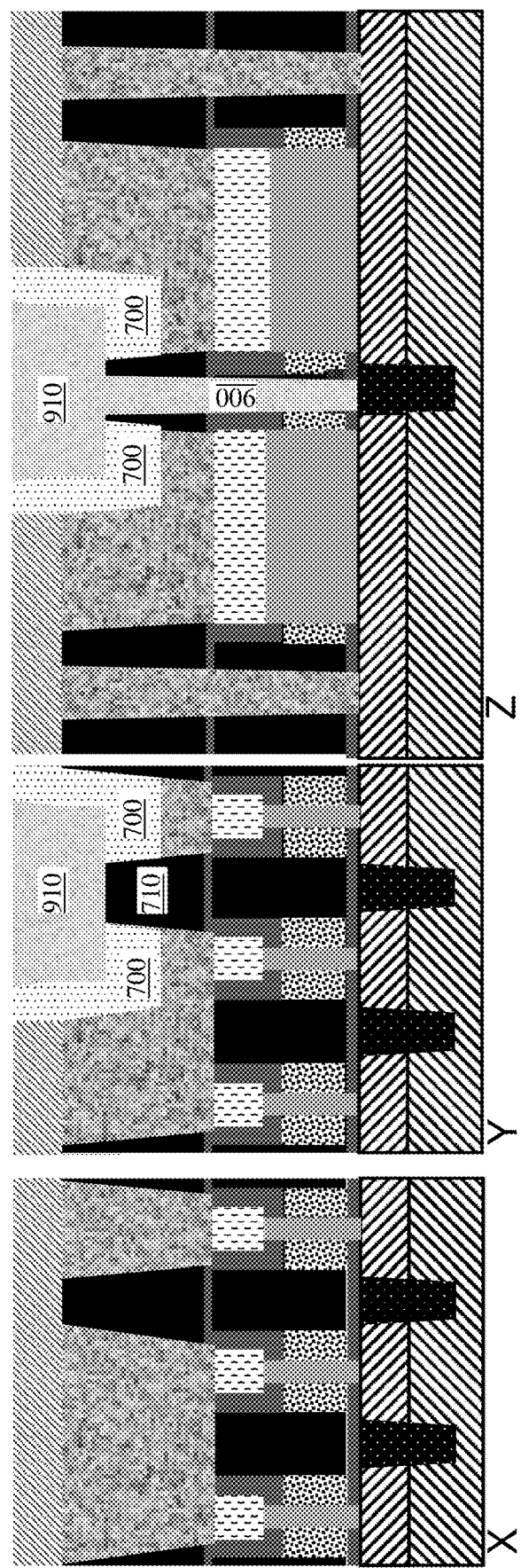
FIG. 9 shows X, Y and Z cross-sections of the vertical FinFET structure after gate contact and gate contact landing formation.
Figure 10:
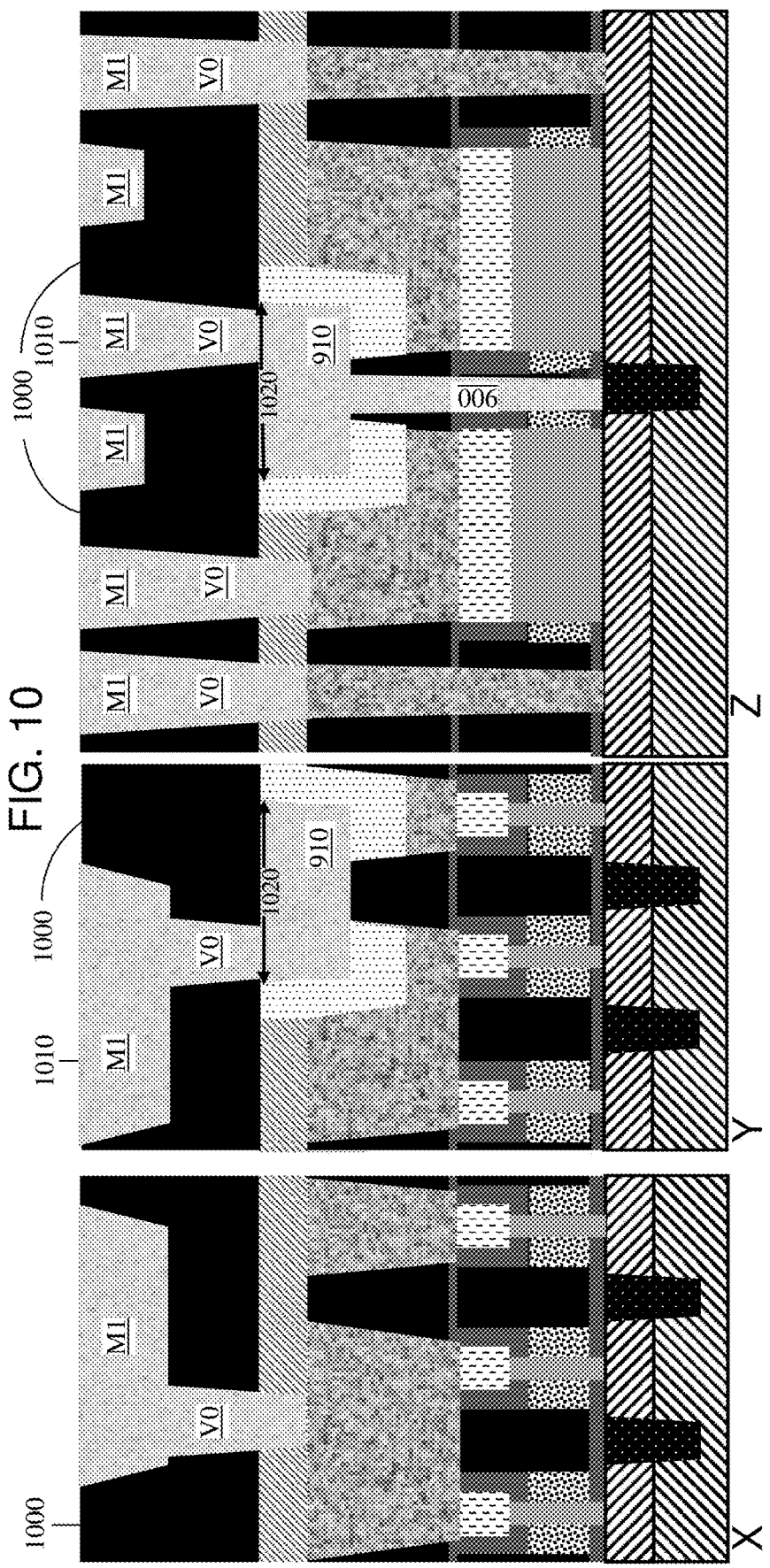
FIG. 10 shows X, Y and Z cross-sections of an ultimate vertical FinFET structure after formation of V0/M1 electrical contacts over at least the gate contact landing.
Figure 11:
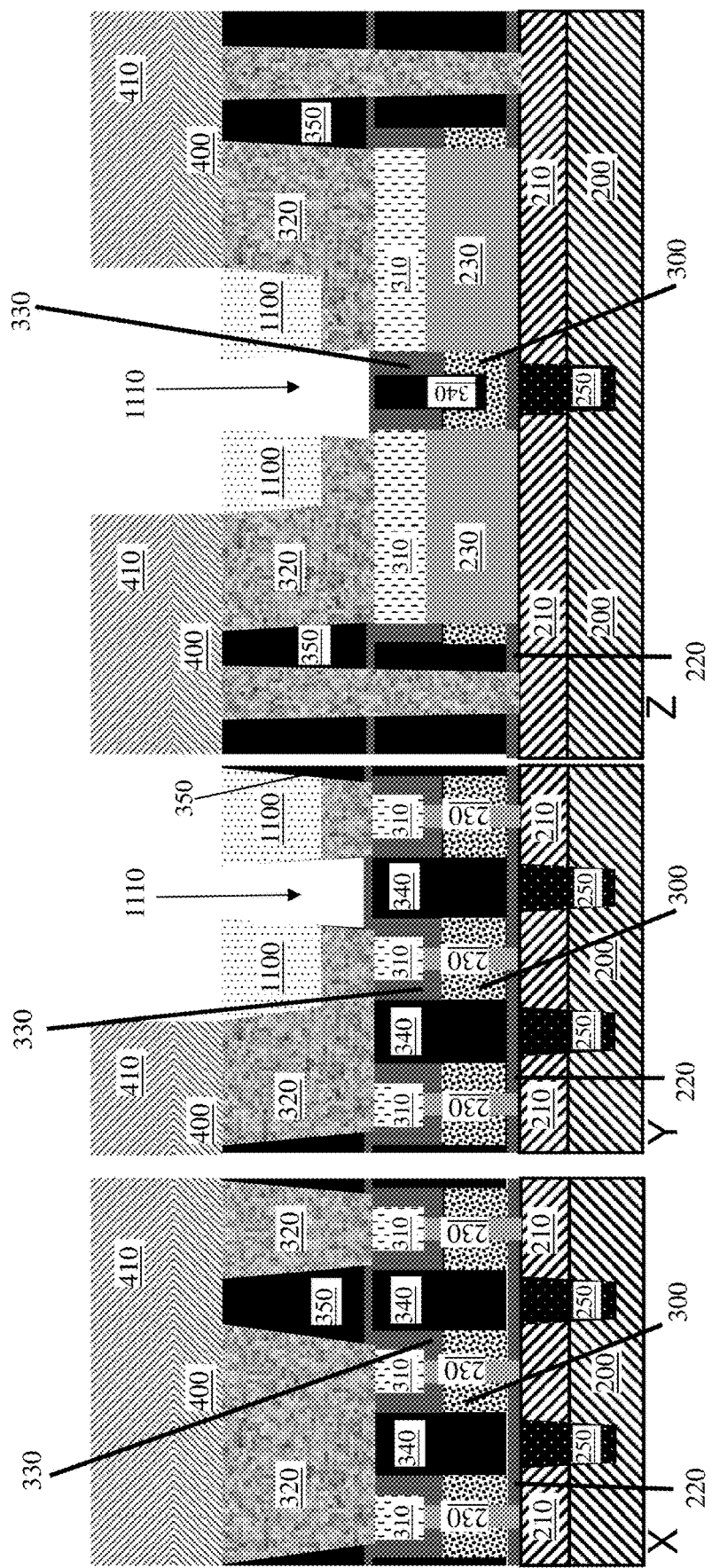
FIG. 11 is alternative to FIG. 6 and shows X, Y and Z cross-sections of the vertical FinFET structure after isolation dielectric etch back as well as oxide etch back.
Figure 12:
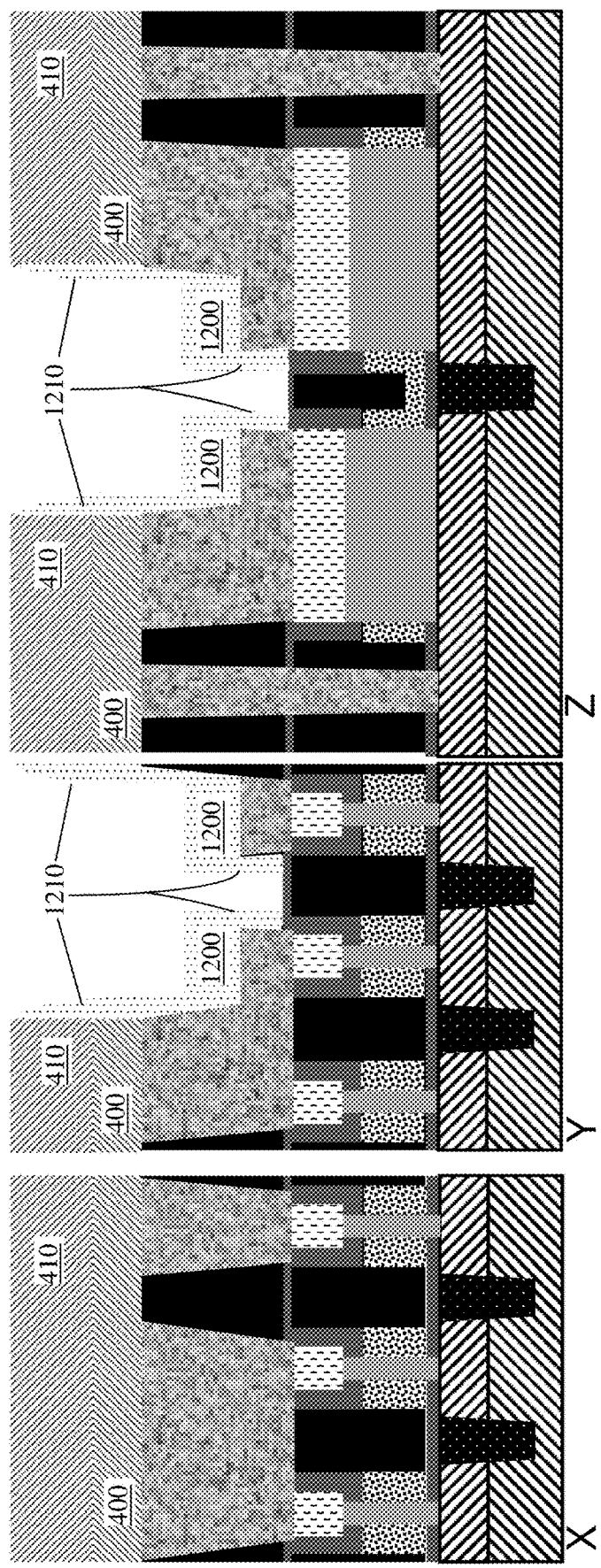
FIG. 12 is alternative to FIG. 7 and shows X, Y and Z cross-sections of the vertical FinFET structure after additional isolation dielectric formation and dielectric pull down.
Figure 13:
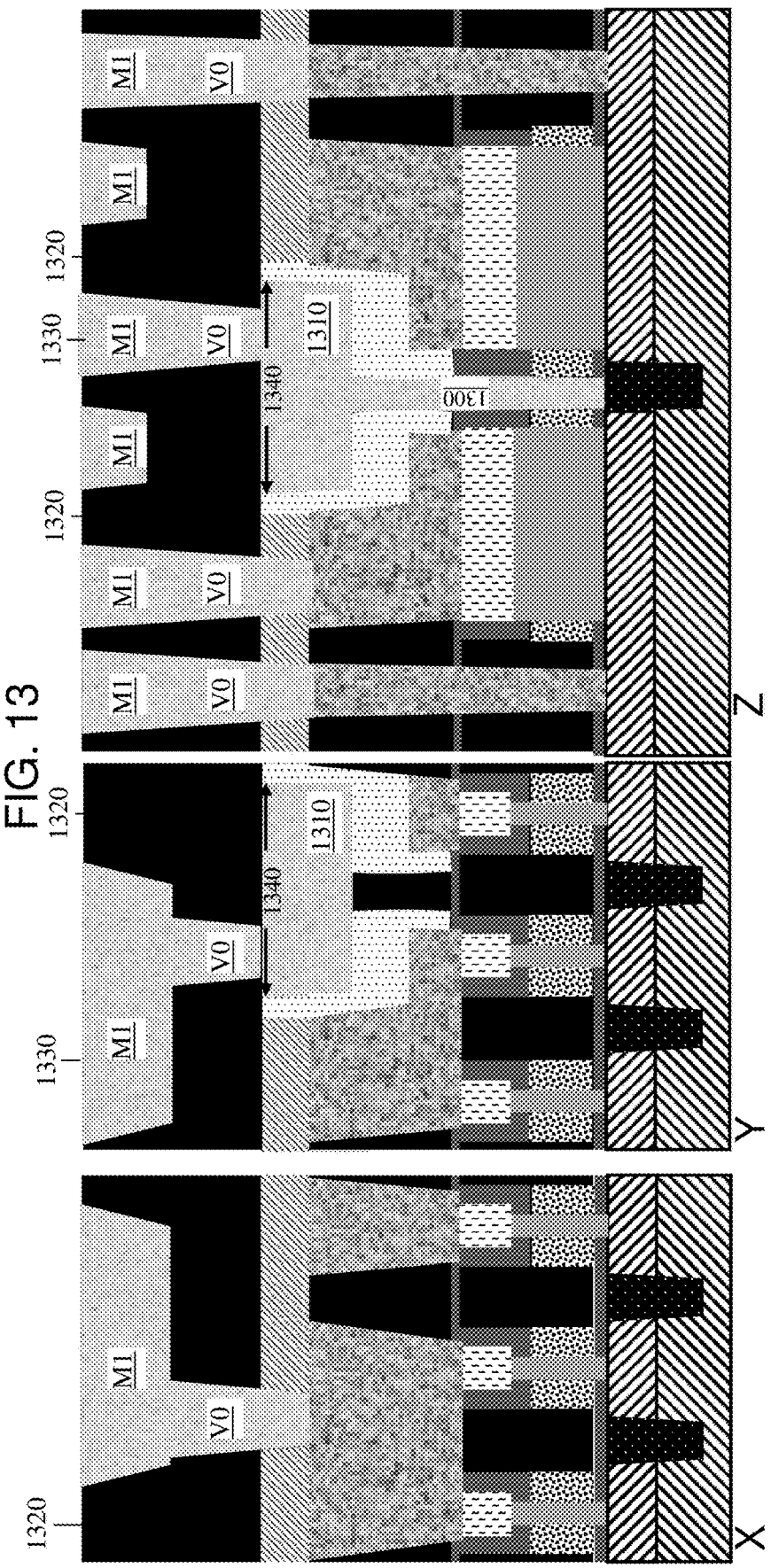
FIG. 13 is alternative to FIG. 10 and shows X, Y and Z cross-sections of an ultimate alternative vertical FinFET structure.
Figure 14:
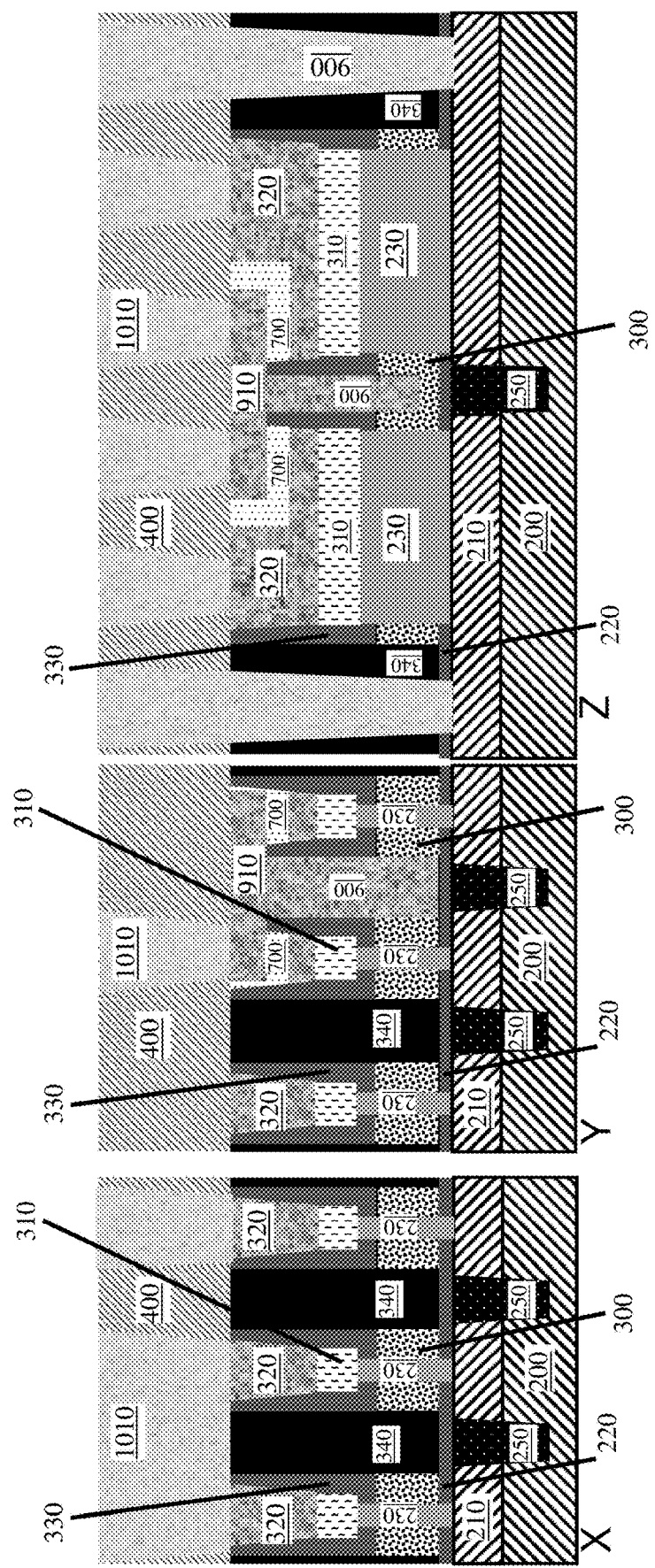
FIG. 14 is alternative to FIG. 10 and FIG. 13 and shows X, Y and Z cross-sections of another ultimate alternative vertical FinFET structure.

With continued reference to cross-sections X, Y and Z as shown in FIG. 1, FIG. 2 through FIG. 10 depict a first embodiment of the disclosure, FIG. 11 through FIG. 13 depict a second embodiment of the disclosure, FIG. 14 depicts a third embodiment of the disclosure, and FIG. 15 depicts a fourth embodiment of the disclosure.

A step-by-step depiction of producing a first embodiment of the disclosure is illustrated in FIG. 2 through FIG. 10. As noted above, cross-sections X, Y and Z in each of the Figures is shown for ease of comprehension of the overall resulting structure.

Figure 2:
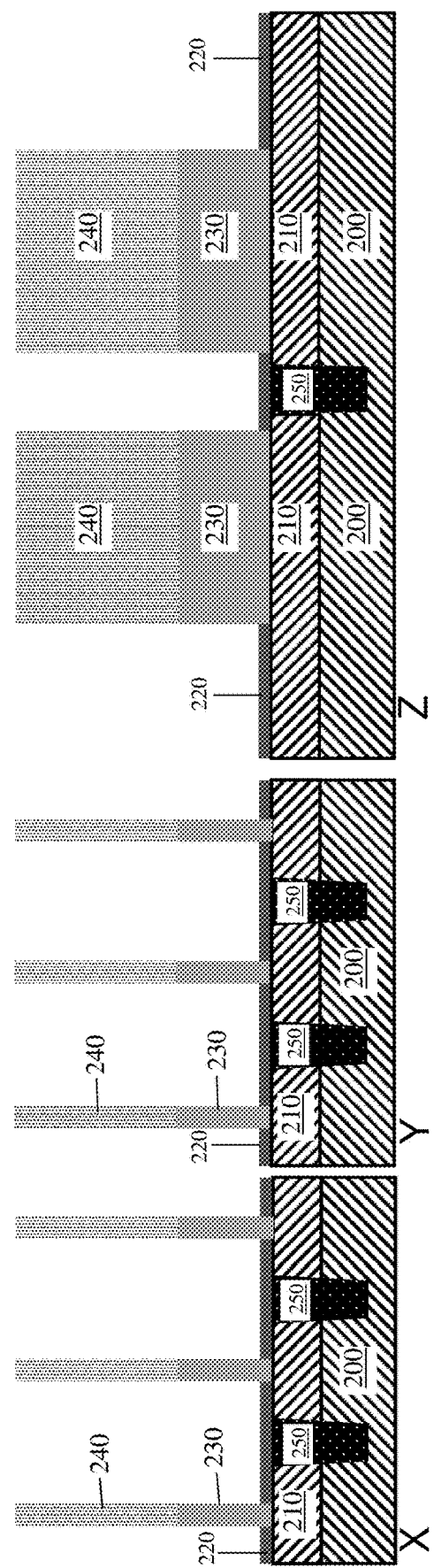
FIG. 2 shows X, Y and Z cross-sections of a starting, partial vertical FinFET structure.

FIG. 2 depicts a starting, partial, vertical FinFET structure that may be formed by any now known or later developed manufacturing techniques. The starting structure includes a substrate 200 with a bottom S/D layer 210 thereover. Substrate 200 can be composed of any currently known or later developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity).

Bottom S/D layer 210 can be epitaxially grown on substrate 200. The terms "epitaxially grown and/or formed" and "epitaxial growth" mean the growth of a semiconductor material on a deposition surface of a semiconductor material, in which the semiconductor material being grown may have the same crystalline characteristics as the semiconductor material of the deposition surface. In an epitaxial growth process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth processes may be selective to forming on semiconductor surfaces, and may not deposit material on dielectric surfaces, such as silicon dioxide or silicon nitride surfaces.

The starting structure also includes a plurality of fins 230 extending vertically upward from bottom S/D layer 210. Fins 230 can be formed by any now know or later developed fin formation technique and can be composed of any suitable fin material including, but not limited to, the above mentioned materials for substrate 200. A hardmask layer 240 over fins 230 is depicted in FIG. 2 and is merely one potential remnant of the fin formation process selected. As will become evident in FIG. 3, this (and any other) remnant(s) of the fin formation process are removed before proceeding with the methods of the disclosure. While not of particular importance, it is noted that hardmask layer 240 may be comprised of any one or more of a variety of different insulative materials, such as $Si_3N_4$, SiBCN, SiNC, SiN, SiCO, $SiO_2$ and SiNOC.

Considering the X and Y cross-sections of the structure as depicted in FIG. 1, it is noted that a first portion of bottom S/D layer 210 is formed over a first portion of substrate 200, i.e., the X cross-section of FIG. 2, and a second portion of bottom S/D layer 210 is formed over a second portion of substrate 200, i.e., the Y cross-section of FIG. 2. This is pertinent to the above-described subsequent fins 230 formation wherein FIG. 2 depicts the formation of at least two fins 230 (in this instance three) over the first portion of bottom S/D layer 210, i.e., the X cross-section, and the at least two fins 230 (in this instance three again) over the second portion of bottom S/D layer 210, i.e., the Y cross-section.

The starting structure of FIG. 2 additionally includes one or more shallow trench isolations (STIs) 250 formed between adjacent fins 230 and within bottom S/D layer 210 and substrate 200. STIs 250 may be composed of any suitable trench isolation material, for example, $SiO_2$ or SiN, or a combination of isolation/dielectric materials such as the combination of SiN and $SiO_2$.

The starting structure of FIG. 2 further includes a bottom spacer layer 220 formed over bottom S/D layer 210 and tops of STIs 250. Bottom spacer layer 220 can be formed by a depositing technique, and more specifically can be formed by a direction depositing technique. "Depositing" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. "Directional depositing" may include any now known or later developed techniques appropriate for the material to be deposited to horizontal surfaces (not sidewalls), including but not limited to, for example: high density plasma (HDP) deposition or gas cluster ion beam (GCIB) deposition. Bottom spacer layer 220 may be comprised of, for example, SiBCN, SiNC, SiN, $Si_3N_4$, SiCO, $SiO_2$ or SiNOC.

Figure 3:
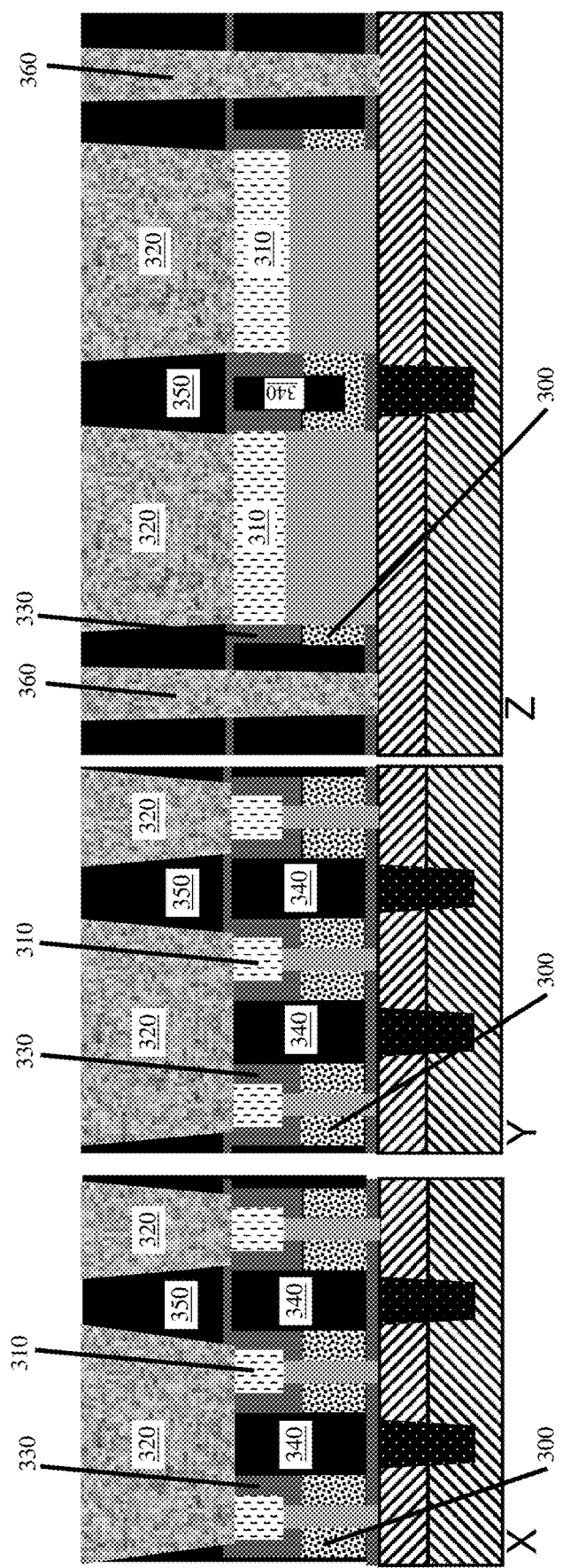
FIG. 3 shows X, Y and Z cross-sections of the vertical FinFET structure after high-k metal gate (HKMG) layer, top source/drain (S/D) layer and top S/D contacts formation.

Moving forward from the starting structure of FIG. 2, FIG. 3 depicts the result of a plurality of processing steps including, in part, the formation of a high-k metal gate (HKMG) layer 300, a top source/drain (S/D) layer 310 and multiple (at least two) top S/D contacts 320.

More specifically, FIG. 3 depicts the result of forming, for instance by deposition, the HKMG layer 300 over bottom spacer layer 220 such that a top surface 300a of HKMG layer 300 is below tops of fins 230. HKMG 300 can comprise various films and can be different for different types of devices (e.g., NFET, PFET, etc.). The high-k dielectric material of HKMG 300 can be any suitable high-k dielectric material, for example, $HfO_2$ and $ZrO_2$. The metal gate of HKMG 300 can comprise a work function metal such as TiN, TiC, TiAl, TaN, etc. and can further comprise one or more low resistance conducting metals such as W, Co and Ru.

FIG. 3 also depicts the formation of a top spacer layer 330 over the HKMG layer 300. Top spacer layer 330 can be deposited and may be comprised of a material the same as or different from bottom spacer layer 220, for example, SiBCN, SiNC, SiN, $Si_3N_4$, SiCO, $SiO_2$ or SiNOC. The formation of the above-mentioned top S/D layer 310 can be achieved by epitaxial growth of a S/D material on the top of each of fins 230, the S/D material for top S/D layer 310 being complementary to that of bottom S/D layer 210.

FIG. 3 further depicts the formation of a lower interlayer dielectric (ILD) 340 within top spacer layer 330 and HKMG layer 300 such that portions of lower ILD 340 are flanking each fin 230. Lower ILD 340 may be composed of any suitable dielectric or isolation material, for example, $SiO_2$ or SiN, or a combination of isolation/dielectric materials such as the combination of SiN and $SiO_2$.

The formation of the above-mentioned top S/D contacts 320 can be achieved by forming multiple (at least two) top S/D contacts 320 such that at least a first pair of top S/D contacts 320 are formed over the top S/D layer 310 of fins 230 formed over the first portion of bottom S/D layer 210 (i.e., a first pair of top S/D contacts in the X cross-section) and at least a second pair of top S/D contacts 320 are formed over the top S/D layer 310 of fins 230 formed over the second portion of bottom S/D layer 210 (i.e., a second pair of top S/D contacts in the Y cross-section). Top S/D contacts 320 can be formed by deposition and can be composed of any conductive metal suitable for a transistor metal contact, for example, W, Co and Ru. The material constituting top S/D contacts 320 may be deposited in openings of a patterned/etched upper ILD layer 350. It is noted that an upper ILD 350 surrounds the top S/D contacts 320 (e.g., remains present in spaces around top S/D contacts 320) as shown in FIG. 3. Upper ILD 350 may be composed of the same dielectric/isolation material as that of lower ILD 340.

FIG. 3 additionally depicts the result of forming bottom S/D contacts 360 (cross-section Z). Bottom S/D contacts 360 can be, for example, trench silicide (TS) regions or vias. Similar to top S/D contacts 320, bottom S/D contacts 360 may be composed of any conductive metal suitable for a transistor metal contact, for example, W, Co and Ru. FIG. 3 depicts the formation of at least two bottom S/D contacts 360 such that a first one passes through upper ILD layer 350 and one portion of lower ILD 340 therebelow and contacts the first portion of bottom S/D layer 210 (i.e., left-hand contact 360 in cross-section Z) and a second one passes through upper ILD layer 350 and one portion of lower ILD 340 therebelow and contacts the second portion of bottom S/D layer 210 (i.e., right-hand contact 360 in cross-section Z).

Figure 4:
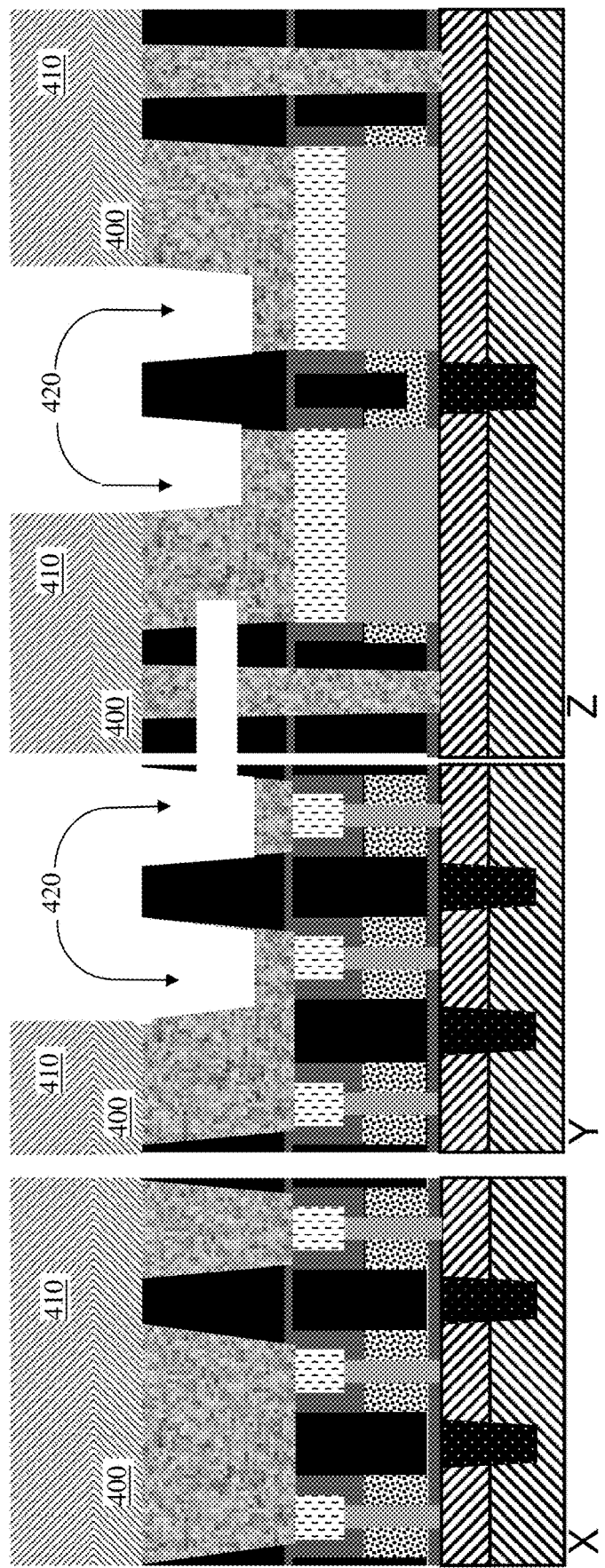
FIG. 4 shows X, Y and Z cross-sections of the vertical FinFET structure after partial recessing of at least two adjacent top S/D contacts.

Moving on to FIG. 4, partial recessing of at least two adjacent top S/D contacts 320 is depicted. More specifically, a cap layer 400 is formed (e.g., by deposition) over top S/D contacts 320 and upper ILD layer 350, and a first organic planarization layer (OPL) 410 is formed (e.g., by spincoating) over cap layer 400. Cap layer 400 may be composed of any suitable cap material, for example, SiC. The combination of cap layer 400 and first OPL 410 may be formed/patterned/etched such that a portion of each of top S/D contacts 320 is exposed.

As particularly shown in FIG. 4, the exposed portions of top S/D contacts 320 are located above adjacent fins (see cross-sections Y and Z). The exposed portions are subsequently etched, thus resulting in etched portions 420. Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches.

Figure 5:
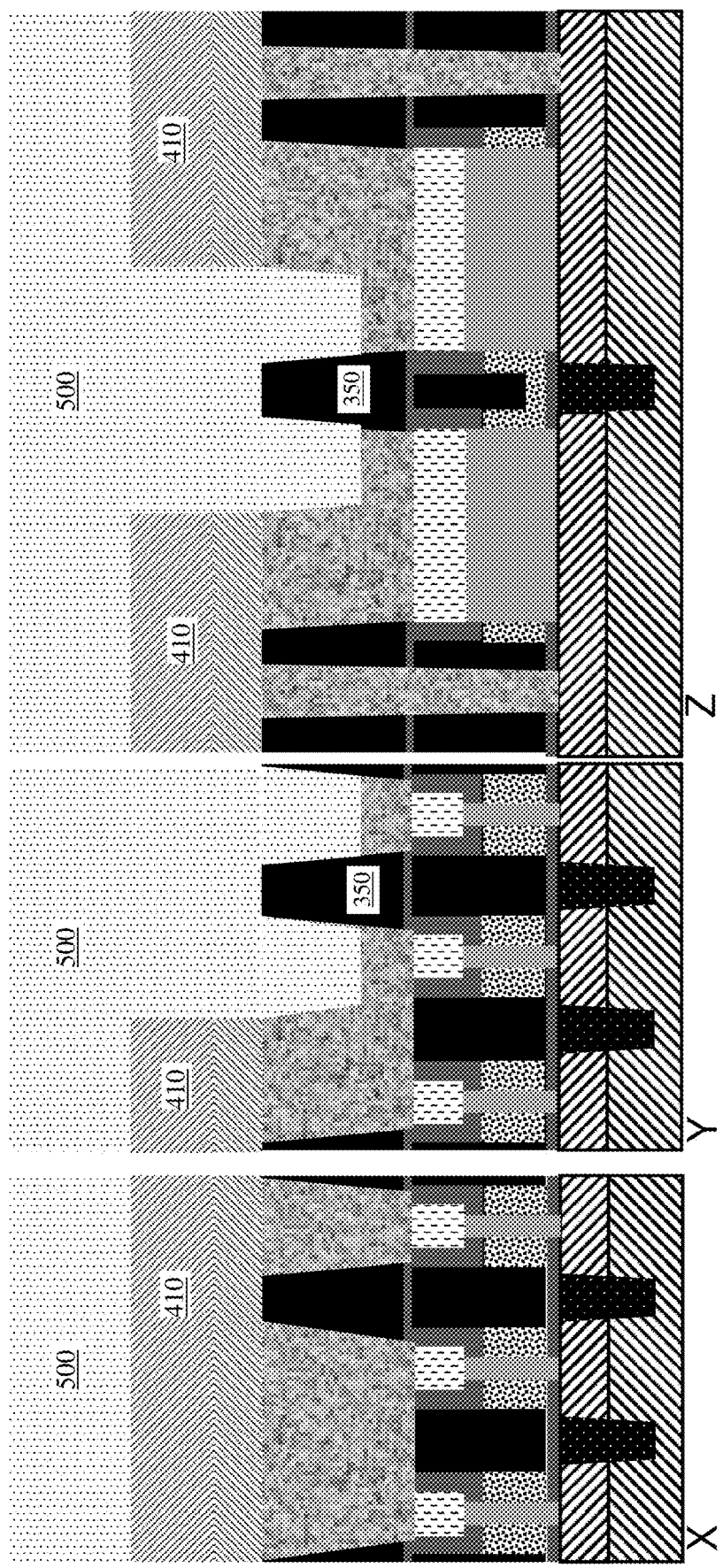
FIG. 5 shows X, Y and Z cross-sections of the vertical FinFET structure after isolation dielectric deposition.

FIG. 5 depicts deposition of an isolation dielectric 500 over first OPL 410 and etched portions 420, thus filling etched portions 420 with isolation dielectric material (see FIG. 4). The deposition of isolation dielectric 500 can be via, for example, ALD and the material deposited can be, for example, SiN, SiBCN or SiNC.

Figure 6:
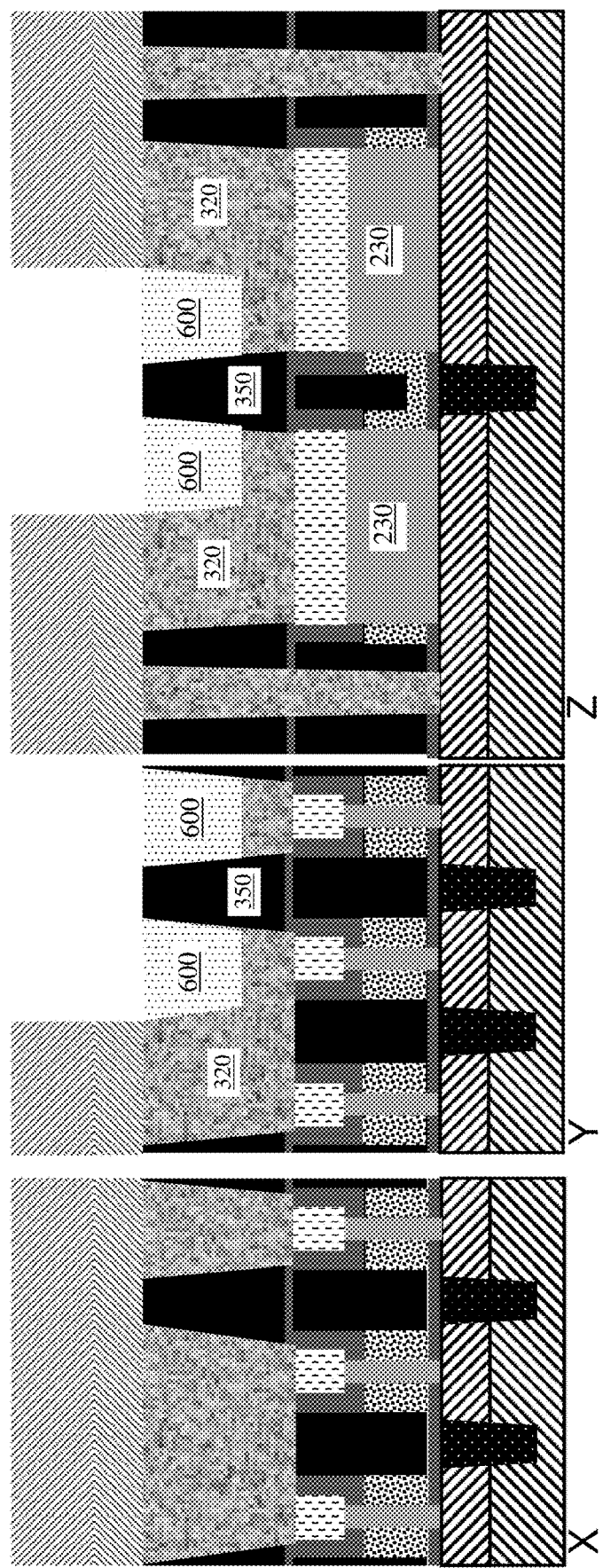
FIG. 6 shows X, Y and Z cross-sections of the vertical FinFET structure after isolation dielectric etch back.

FIG. 6 depicts an etch back process of the isolation dielectric 500 (see FIG. 5) such that remaining isolation dielectric material 600 is present in etched portions 420 of (see FIG. 4) of top S/D contacts 320. Any suitable etching technique as described above can be utilized.

Figure 7:
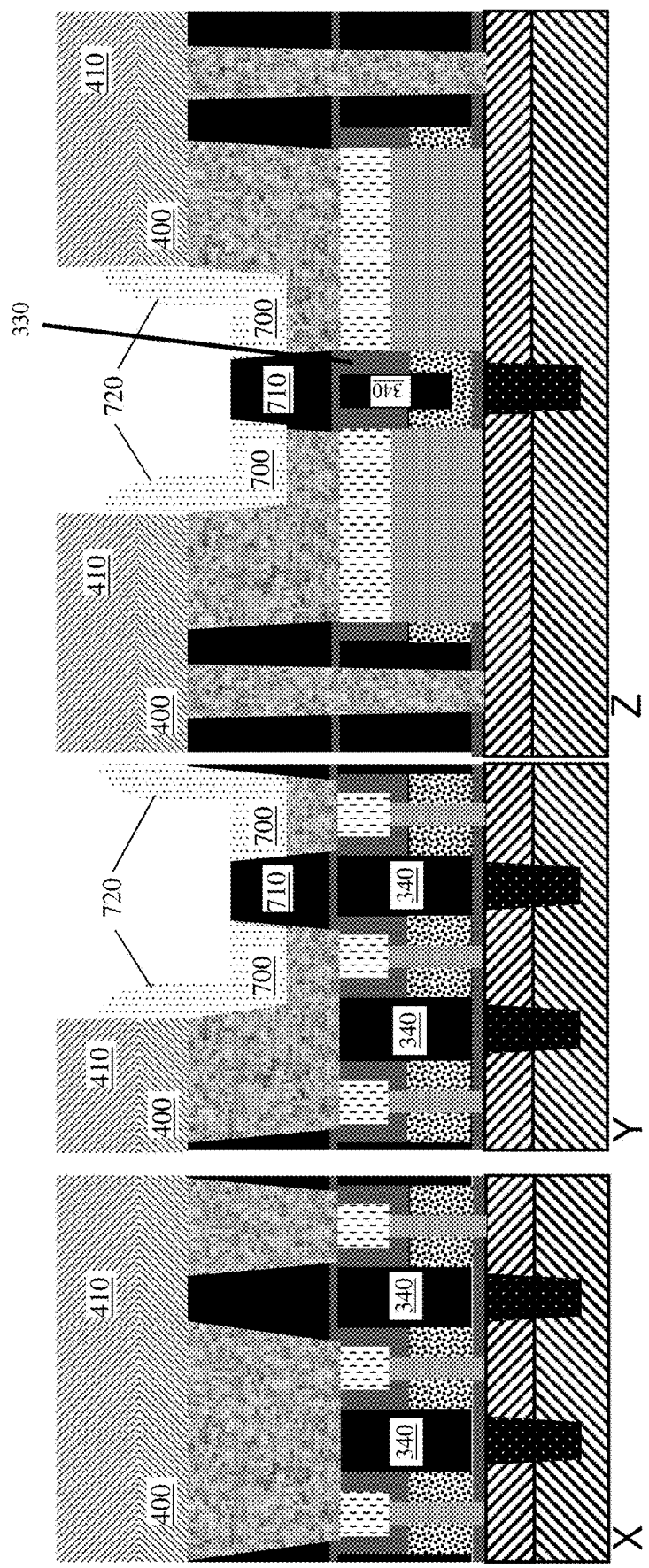
FIG. 7 shows X, Y and Z cross-sections of the vertical FinFET structure after additional isolation dielectric formation and dielectric pull down.

FIG. 7 depicts the formation of additional isolation dielectric material followed by dielectric pull down. More specifically, additional isolation dielectric material is formed (e.g., by deposition) on exposed sidewalls of cap layer 400 and first OPL 410, followed by an anisotropic etching process such that an inner spacer 720 composed of isolation dielectric material is formed. This etching process also partially recesses a portion of dielectric material 600 and a portion of upper ILD layer 350 located above and between adjacent fins 230 (see FIG. 6). After the etching, a recessed ILD layer 710 is present between recessed portions of isolation dielectric material 700.

Figure 8:
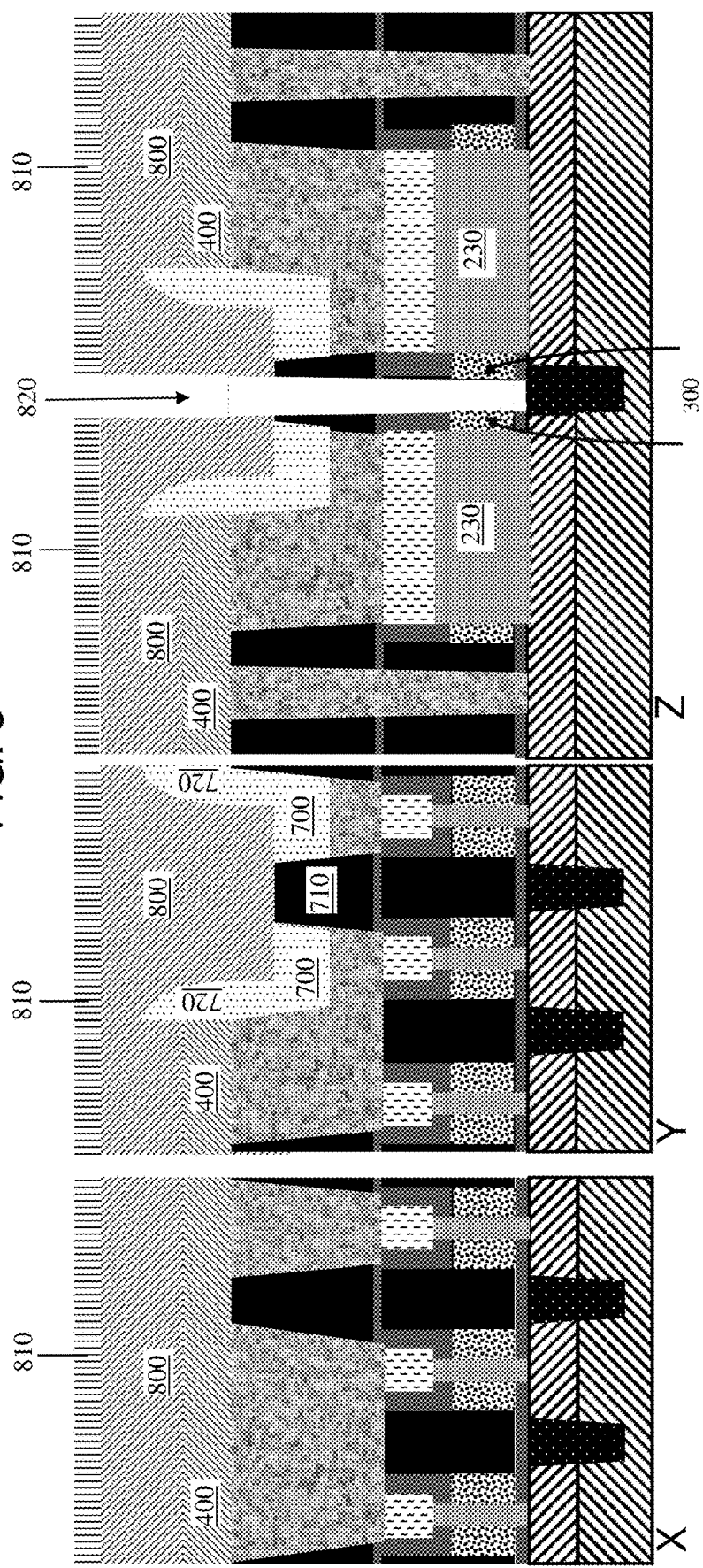
FIG. 8 shows X, Y and Z cross-sections of the vertical FinFET structure after gate contact opening formation.

FIG. 8 depicts gate contact opening formation by firstly removing (e.g., by etching) first OPL 410 (see FIG. 7) which re-exposes cap layer 400, then forming (e.g., by deposition) a second OPL 800 over cap layer 400, isolation dielectric material 720, recessed portions of the isolation dielectric material 700 and recessed ILD layer 710. Second OPL 800 can be composed of the same material as first OPL 410. Next, an anti-reflective coating (ARC) layer 810 is formed (e.g., by deposition) over second OPL 800. Next, a photoresist (not shown) is spincoated over ARC layer 810, followed by a lithography process to define the position and size of the ultimately resulting gate contact (discussed later). Lastly, a gate contact opening 820 is etched between ends of adjacent fins 230 by removing/etching a portion of ARC layer 810, a portion of second OPL 800, a portion of recessed ILD layer 710, a portion of top spacer layer 330, and at least a portion of lower ILD 340 (see FIG. 7), thereby exposing a portion of HKMG layer 300 (see cross-section Z of FIG. 8). It is noted that the photoresist (not shown) is etched away during the gate contact opening 820 etching process.

FIG. 9 depicts gate contact and gate contact landing formation wherein second OPL 800 and ARC layer 810 are firstly removed (e.g. by etching), and then a metal is deposited in gate contact opening 820 (see FIG. 8) to form gate contact 900 and is further deposited on recessed portions of the isolation dielectric material 700 and recessed ILD layer 710 to form gate contact landing 910. The metal may be Co, W, Ru or Cu. If desired, a liner material, for example Ti, TiN, TaN, etc, may deposited in gate contact opening 820 prior to deposition of the gate metal.

FIG. 10 depicts an ultimate vertical FinFET structure of a first embodiment of the disclosure wherein V0 and M1 metallizations have been performed through an additional ILD layer 1000 such that an electrical path 1010 is formed over gate contact landing 910 which electrically couples to gate contact 900 through via V0 and gate contact landing 910. It should be noted here that due to a wide top dimension 1020 of gate contact landing region 910 (wider than convention), the V0 connection for making gate contact through gate contact landing 910 can be placed at multiple locations in FIG. 10, thus affording increased flexibility with gate contact accessibility.

A depiction of producing a second embodiment of the disclosure is illustrated in FIG. 11 through FIG. 13. In this second embodiment, FIG. 11 through FIG. 13 replace FIG. 6 through FIG. 10 of the first embodiment. Thus, the second embodiment is a compilation of FIG. 2 through FIG. 5 followed by FIG. 11 through FIG. 13.

Moving forward from the point of FIG. 5, FIG. 11 depicts a vertical FinFET structure after isolation dielectric etch back (like that of FIG. 6) as well as oxide etch back (different from the first embodiment). More specifically, FIG. 11 depicts an etch back process of the isolation dielectric 500 (see FIG. 5) such that remaining isolation dielectric material 1100 is present in etched portions 420 (see FIG. 4) of top S/D contacts 320. FIG. 11 further depicts removal (e.g. by selective etching) of upper ILD layer 350 (see FIG. 5) located between remaining isolation dielectric material 1100 present in etched portions 420, thereby creating a preliminary gate contact opening 1110. Any suitable etching technique as described above can be utilized for the removal of the isolation dielectric 500 and the upper ILD layer 350.

FIG. 12 depicts forming (e.g., by deposition) additional isolation dielectric material 1210 on exposed sidewalls of cap layer 400 and first OPL 410 as well as on sidewalls of preliminary gate contact opening 1110 (see FIG. 11). FIG. 12 also depicts recessing (e.g., by anisotropic etching) of a portion of dielectric material 1100 (see FIG. 11) to form recessed portions of dielectric material 1200. FIG. 12 differs from the first embodiment of the disclosure as depicted in FIG. 7 in that no recessed ILD layer 710 is maintained (as is the case in FIG. 7). FIG. 12 also differs from the first embodiment of the disclosure as depicted in FIG. 7 in that an isolation dielectric lined preliminary gate contact opening exists in FIG. 12 (which is not the case in FIG. 7). This structure as depicted in FIG. 12 better enables self-aligned contact formation.

FIG. 13 depicts an ultimate vertical FinFET structure of the second embodiment of the disclosure wherein processing similar to that described with respect to FIG. 8 and FIG. 9 has been performed, followed by V0 and M1 metallizations. The notable change in the second embodiment to the processing as described for FIG. 8 and FIG. 9 of the first embodiment is that second OPL 800 (see FIG. 8) is additionally formed in preliminary gate contact opening 1110 (see FIG. 11) and the etching of gate contact opening 820 (see FIG. 8) is through/encompasses preliminary gate contact opening 1110 (see FIG. 11). The V0 and M1 metallizations that are depicted in resulting FIG. 13 have been introduced through an additional ILD layer 1320 such that an electrical path 1330 is formed over gate contact landing 1310 which electrically couples to gate contact 1300 through via V0 and gate contact landing 1310. It is noted that due to a wide top dimension 1340 of gate contact landing 1310 (wider than convention), the V0 connection for making gate contact through gate contact landing 1310 can be placed at multiple locations in FIG. 13, thus affording increased flexibility with gate contact accessibility.

FIG. 14 depicts an ultimate vertical FinFET structure of a third embodiment of the disclosure. The processing of the third embodiment is adjusted slightly from that of the first and second embodiments (e.g., different top S/D contact size/shape, smaller contact landing height, larger contact landing width, and different contact landing depth within overall structure), while still adhering to the essence of the disclosure. Like numbering with FIG. 10 and/or FIG. 13 represents like elements.

FIG. 15 depicts an ultimate vertical FinFET structure of a fourth embodiment of the disclosure. The processing of the fourth embodiment is adjusted slightly from that of the first and second embodiments (e.g., different top S/D contact size/shape, smaller contact landing height, and different contact landing depth within overall structure), while still adhering to the essence of the disclosure. Like numbering with FIG. 10 and/or FIG. 13 represents like elements.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

We claim:

1. A method of forming a gate contact over an active region for a vertical FinFET, the method comprising:
    providing a partial vertical FinFET (VFinFET) structure, the partial VFinFET structure including a substrate having a bottom source/drain (S/D) layer thereover and a plurality of fins extending vertically therefrom, a bottom spacer layer over the bottom S/D layer, a high-k metal gate (HKMG) layer over the bottom spacer layer, and a top spacer layer over the HKMG layer;
    forming a top S/D layer on a top surface of each of the fins;
    forming at least two top S/D contacts on the top S/D layer and an upper interlayer dielectric (ILD) layer surrounding the at least two top S/D contacts, the at least two top S/D contacts being located directly above at least two adjacent fins;
    creating recesses in a portion of each of the at least two top S/D contacts;
    forming an isolation dielectric within a portion of the recesses, a remaining portion of the recesses being a gate contact landing region above the at least two adjacent fins;
    removing at least a portion of the upper ILD layer and at least a portion of the top spacer layer between adjacent ends of the at least two adjacent fins to expose a portion of the HKMG layer located thereunder, thereby forming a gate contact opening; and
    forming a gate contact in the gate contact opening and a gate contact landing in the gate contact landing region.

2. The method of claim 1, wherein the providing of the partial VFinFET comprises:
    forming a first portion of the bottom S/D layer over a first portion of the substrate and a second portion of the bottom S/D layer over a second portion of the substrate;
    forming at least two fins of the plurality of fins over the first portion of the bottom S/D layer and at least another two fins of the plurality of fins over the second portion of the bottom S/D layer;
    forming one or more shallow trench isolations (STIs) between adjacent fins and within the bottom S/D layer and substrate;
    forming the bottom spacer layer over a top surface of the bottom S/D layer and a top surface of the STIs;
    forming the HKMG layer over the bottom spacer layer, the HKMG layer having a top surface below a top surface of the plurality of fins; and
    forming the top spacer layer on the top surface of the HKMG layer.

3. The method of claim 2, wherein the forming of the top S/D layer comprises:
    epitaxially growing a S/D material on the top surface of each of the fins such that the top S/D layer is formed on the top surface of each of the at least two fins formed over the first bottom S/D layer and on the top surface of each of the at least another two fins formed over the second bottom S/D layer.

4. The method of claim 1, further comprising:
    forming a lower interlayer dielectric (ILD) within the top spacer layer and the HKMG layer, portions of the lower ILD flanking each fin of the plurality of fins.

5. The method of claim 2, wherein the forming of the at least two top S/D contacts comprises:
    forming at least two pair of the top S/D contacts, wherein a first pair of the top S/D contacts includes a first top S/D contact formed over the top S/D layer of at least one fin formed over the first portion of the bottom S/D layer and a second top S/D contact formed over the top S/D layer of at least one other fin formed over the first portion of the bottom S/D layer; and
    a second pair of the top S/D contacts includes a first top S/D contact formed over the top S/D layer of at least one fin formed over the second portion of the bottom S/D layer and a second top S/D contact formed over the top S/D layer of at least one other fin formed over the second portion of the bottom S/D layer.

6. The method of claim 5, further comprising:
    forming at least two bottom S/D contacts, a first bottom S/D contact passing through the upper ILD layer and one portion of the lower ILD therebelow and contacting the first portion of the bottom S/D layer, a second bottom S/D contact passing through the upper ILD layer and one portion of the lower ILD therebelow and contacting the second portion of the bottom S/D layer;
    forming a cap layer over a top surface of the first and second pairs of top S/D contacts and over a top surface of the upper ILD layer such that a portion of each of the top S/D contacts is exposed, the exposed portions of the first pair of the top S/D contacts being located above adjacent fins and the exposed portions of the second pair of the top S/D contacts being located above adjacent fins; and forming a first organic planarization layer (OPL) over the cap layer.

7. The method of claim 6, wherein the creating of the recesses in the top S/D contacts comprises:
etching the exposed portions of the first and second pairs of the top S/D contacts.

8. The method of claim 7, wherein the forming of the isolation dielectric comprises:
filling the etched portions with isolation dielectric material;
forming additional isolation dielectric material on exposed sidewalls of the cap layer and the first OPL; and
recessing a portion of the isolation dielectric material and a portion of the upper ILD layer located above and between adjacent fins such that the upper ILD layer located between recessed portions of the isolation dielectric material is maintained.

9. The method of claim 8, further comprising:
removing the first OPL;
forming a second OPL over the cap layer, the isolation dielectric material and the recessed portion of the upper ILD layer; and
forming an anti-reflective coating (ARC) layer over the second OPL.

10. The method of claim 9, wherein the forming of the gate contact opening comprises:
etching the gate contact opening between adjacent ends of at least one fin above the first portion of the bottom S/D layer and at least one fin above the second portion of the bottom S/D layer.

11. The method of claim 10, further comprising:
removing the second OPL and the ARC layer.

12. The method of claim 11, wherein the forming of the gate contact and the gate contact landing comprises:
depositing a metal in the gate contact opening to form the gate contact, and
depositing the metal in the recessed portion of the isolation dielectric material and on the recessed portion of the upper ILD layer to form the gate contact landing.

13. The method of claim 12, further comprising:
performing one or more of V0 and M1 metallizations such that an electrical path is formed over the gate contact landing and electrically couples to the gate contact through the gate contact landing.

14. The method of claim 7, wherein the forming of the isolation dielectric comprises:
filling the etched portions with isolation dielectric material;
removing the upper ILD layer located between the filled portions of isolation dielectric material to create a preliminary gate contact opening;
forming additional isolation dielectric material on exposed sidewalls of the cap layer and the first OPL and on sidewalls of the preliminary gate contact opening; and
recessing a portion of the isolation dielectric material located above and between adjacent fins.

15. The method of claim 14, further comprising:
removing the first OPL;
forming a second OPL over the cap layer, the isolation dielectric material and in the preliminary gate contact opening; and
forming an anti-reflective coating (ARC) layer over the second OPL.

16. The method of claim 15, wherein the forming of the gate contact opening comprises:
etching a subsequent gate contact opening between adjacent ends of at least one fin above the first portion of the bottom S/D layer and at least one fin above the second portion of the bottom S/D layer, the subsequent gate contact opening encompassing the preliminary gate contact opening.

17. The method of claim 16, further comprising:
removing the second OPL and the ARC layer.

18. The method of claim 17, wherein the forming of the gate contact and the gate contact landing comprises:
depositing a metal in the subsequent gate contact opening to form the gate contact, and
depositing the metal in the recessed portion of the isolation dielectric material to form the gate contact landing.

19. The method of claim 18, further comprising:
performing one or more of V0 and M1 metallizations such that an electrical path is formed over the gate contact landing and electrically couples to the gate contact through the gate contact landing.

20. A vertical FinFET device having a gate contact over an active region, the device comprising:
a substrate having a bottom source/drain (S/D) layer thereover and a plurality of fins extending vertically therefrom;
a bottom spacer layer over the bottom S/D layer;
a high-k metal gate (HKMG) layer over the bottom spacer layer, the HKMG layer having a top surface below a top surface of the plurality of fins;
a top spacer layer over the HKMG layer; a top S/D layer on a top surface of each of the fins;
at least two top S/D contacts on the top S/D layer, the at least two top S/D contacts being located directly above at least two adjacent fins;
an upper interlayer dielectric (ILD) layer surrounding the at least two top S/D contacts;
an isolation dielectric within a portion of a recess in a portion of each of the at least two top S/D contacts;
a gate contact landing of a different material than the HKMG within a remaining portion of the recess; and
a gate contact extending vertically from a bottom surface of the gate contact landing and contacting a portion of the HKMG layer located between adjacent ends of at least two fins.

* * * * *